United States Patent [19]

Grande et al.

[11] Patent Number: 5,757,357
[45] Date of Patent: May 26, 1998

[54] METHOD AND SYSTEM FOR DISPLAYING DIGITAL DATA WITH ZOOM CAPABILITY

[75] Inventors: Mark J. Grande, Horsham; Howard Maisenhelder, III, Roslyn, both of Pa.

[73] Assignee: Moore Products Co., Spring House, Pa.

[21] Appl. No.: 268,497

[22] Filed: Jun. 30, 1994

[51] Int. Cl.⁶ .................................................. G09G 5/00
[52] U.S. Cl. ................................. 345/134; 324/121 R
[58] Field of Search ............................ 345/134, 127, 345/131; 73/866.3; 324/113, 121 R, 379, 394; 364/237.7, 921.8, 178, 179, 182, 188, 189, 413.05, 413.06, 550

[56] References Cited

U.S. PATENT DOCUMENTS

| | | | |
|---|---|---|---|
| 4,197,590 | 4/1980 | Sukonick et al. | 364/900 |
| 4,734,869 | 3/1988 | Mickowski | 364/550 |
| 4,967,381 | 10/1990 | Lane et al. | 364/551 |
| 5,146,550 | 9/1992 | Furter et al. | 395/140 |
| 5,178,010 | 1/1993 | Holzel | 73/384 |
| 5,179,639 | 1/1993 | Taaffe | 395/128 |
| 5,261,031 | 11/1993 | Saito | 395/140 |
| 5,280,422 | 1/1994 | Moe et al. | 364/140 |
| 5,311,451 | 5/1994 | Barrett | 364/550 |

*Primary Examiner*—Jeffery Brier
*Attorney, Agent, or Firm*—Seidel, Gonda, Lavorgna & Monaco, PC

[57] ABSTRACT

A system and method for process instrumentation and control equipment. The system including a paperless, microprocessor-based, panelboard recorder having built-in data acquisition functions, a mechanism for archiving data, and a variety of display types. Memory space is conserved by deriving quantized data comprising signal samples received at a first rate and storing them for a first relatively short period in a fine quantized memory, and storing in a coarse memory, for a longer period of time, a subset of said signal samples recurring at a rate lower than the first set and having fewer quantized levels than the first set of samples. The operator can then determine whether coarse data obtained over a relatively long period or fine data obtained over a shorter period are displayed.

4 Claims, 9 Drawing Sheets

METHOD AND SYSTEM FOR DISPLAYING DIGITAL DATA WITH ZOOM CAPABILITY

FIELD OF THE INVENTION

This invention generally relates to digital chart recorders which display time-sequentially acquired data as a trend graph, and more specifically to a method and apparatus capable of enhancing the display of specific user-identified portions of the acquired data.

BACKGROUND OF THE INVENTION

Test measurements have historically been recorded on analog chart recorders. These recorders are characterized by a roll of chart paper on which the measurement data is recorded. The chart paper scrolls while a stylus, or styluses, provide ink traces on it corresponding to these measurements. Alternatively, thermo-sensitive paper is used with an appropriate stylus. Analog chart recorders have physically moving parts, and all measurements are recorded on a real time basis.

A significant problem associated with such previous recorders is the labor-intensive maintenance required. Paper rolls, ink pens, cylinders, etc. must continually be replaced and reset. In addition, mechanical linkages wear out and become misaligned.

As with many analog devices, previous chart recorders are susceptible to noise. This is especially true when the gain is increased in order to achieve a higher resolution of the acquired data. A stylus can easily peg itself to a maximum allowable deflection when noise is detected. Also, once the ink tracings have been made, there is no method of recreating the data signals. Thus, after the data signals have been memorialized on the chart paper, no further manipulation or adjustments can be made to the ink trace on the chart paper.

With the advent of microprocessors and complex software programs, task-specific digital recorders have become known and have eliminated some of the problems associated with analog recorders; however, their resolution has been less than desired.

SUMMARY OF THE INVENTION

The present invention is a process and system for producing visual indications of signal-representing variations in a process variable over periods of time. The system includes a sampling means for deriving a set of time-spaced samples of the signals at a predetermined first repetition rate, and a memory means for storing these samples. In addition, a visual display means connected to the memory means displays the stored samples under the command of an operator.

The memory means includes at least two separate memories. The first memory bank is a "fine memory" or "zoom" memory, in which the above-mentioned samples are stored. The second memory is a coarse or "regular" memory which stores a second set of samples from the sampling means, recurring at a second repetition rate lower than the first repetition rate, for a second time period of greater duration than the first time period.

The system further comprises a manually controllable accessing and switching means connected to the fine memory and to the coarse memory for either:

(a) supplying the stored lower repetition rate samples from the coarse memory to the visual display means to produce a coarse display of said lower repetition rate samples as a function of time, or (b) supplying the stored higher repetition rate samples from the fine memory to the visual display means to produce a fine display of the higher repetition rate samples as a function of time as selected by the operator.

Preferably the second set of samples is derived from the first set, and preferably each sample of the second set is represented by fewer bits than are the samples of the first set. Because the second set of samples is fewer in number, and each is represented by fewer bits, it requires less bit storage space than the first set, over any given period of time. It is therefore possible to store samples of the first set extending over a much greater period of time than for the second set, using for example coarse and fine memories of equal capacities. In this way it becomes practical to provide a coarse display of samples extending backward in time for a long period when desired, and by switching to the fine display, present a much higher resolution of displayed data, albeit extending backward over a lesser period in time.

The foregoing and other objects, features and advantages of the invention will be apparent from the following detailed description taken with the accompanying drawings.

DETAILED DESCRIPTION OF THE PREFERRED EMBODIMENT

Figure 1:
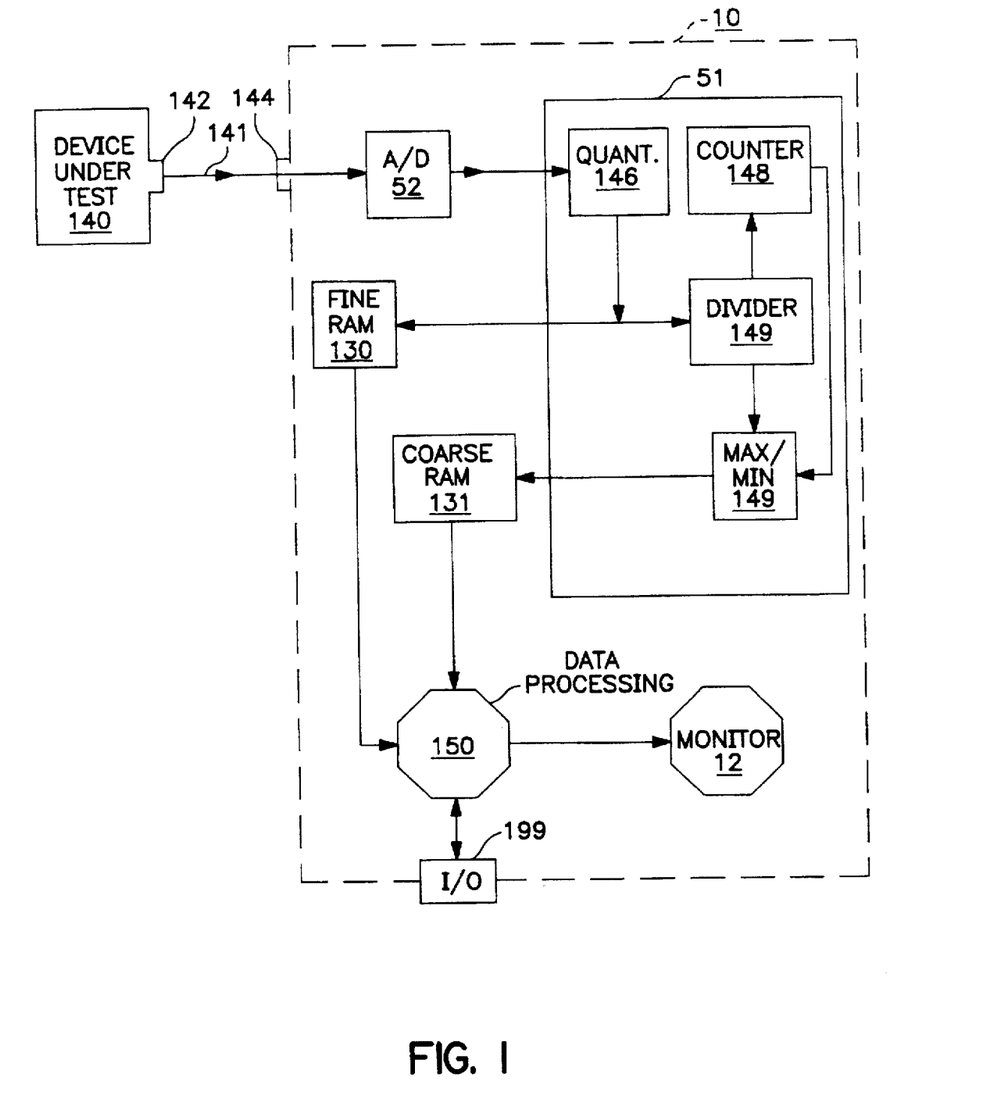
FIG. 1 is a schematic block diagram of a system having the zoom capability in accordance with the present invention.

The instant invention deals with a method and apparatus for providing a zoom capability for a digital graph recorder. As seen in FIG. 1, the digital recorder is generally indicated as 10. A device under test 140 has an output connector 142. Line 141 connects the testing device 140 to the recorder 10. The recorder may have a plurality of inputs 144 to which the line 141 can be connected. Normally the output of device 140 is an analog signal.

The recorder is designed to sample the output of device 140 at a fixed rate, producing a first set of samples at a first repetition rate. In the preferred embodiment, recorder 10 samples the output of device 140 once every 0.5 seconds. The analog-to-digital (A/D) converter 52 converts the analog signal into a digital signal. This digital signal is input into a signal conditioner 51. The signal conditioner can manipulate the signal in a variety of ways which will be described later. However, at a minimum, the signal conditioner includes a quantizer 146 which quantizes the digital signal into twelve bit bytes. The twelve bit numbers are then stored in a "fine" database random access memory (RAM) 130. The output of the quantizer is also input into a divider 139. In the preferred embodiment, the divider is a divide-by-sixteen divider which reduces the twelve bit byte to an eight bit byte.

The sampling rate of the coarse database is configured in accordance with the type of measurements taken and the operators' preference. A counter 148 then counts the number of eight bit bytes which correspond to the measurements from the device 140 under test. For example, in the preferred embodiment, the fine resolution sampling rate is such as to take a reading every 0.5 seconds. If the desired coarse sampling rate is to take a measurement every minute, the counter is configured to count 120 readings. [(Two samples per second)×(60 seconds)=120 measurements]. The maximum and minimum values taken during each coarse sampling interpulse period are detected by a computer or maximum/minimum device 149. Both the maximum and minimum values are stored in the coarse random access memory 131.

A data processing unit 150, under the control of an operator, retrieves the stored data in either the fine RAM 130 or the coarse RAM 131 for display on a monitor 12. An input/output (I/O) device 199 is connected to the data processing unit 150. The I/O device 199, e.g., a keyboard and monitor, is used by the operator to control and configure the system. The data processing unit 150 may include the controls for configuring the coarse sampling rate and for changing the vertical and horizontal resolution of the chart displayed on the monitor.

The data processing unit may also control other information displayed on the monitor including time, date and any identifying indicia.

As mentioned, both the maximum and minimum values are stored in the coarse RAM 131. In addition, both the maximum and minimum values are also displayed on the monitor 12 during coarse display. This allows the operator to detect any gross anomalies occurring in the measurements from the device under test 140; normally, the difference between the maximum and minimum values is minimal, and appears to the eye as one data point on the chart.

The use of separate databases for the zoom and coarse measurements has several advantages. First, if all of the data used for the fine measurements were stored, large amounts of memory would be needed. However, since the coarse sample rate is usually magnitudes smaller than the fine sample rate, the amount of memory needed for normal long-term display is drastically reduced. Second, the high resolution of the zoom database allows one to display the same data at various settings using different magnifications, chart speeds, etc. Accordingly, the digital recorder 10 can be used in more applications and can be configured more easily by the user.

Figure 2:
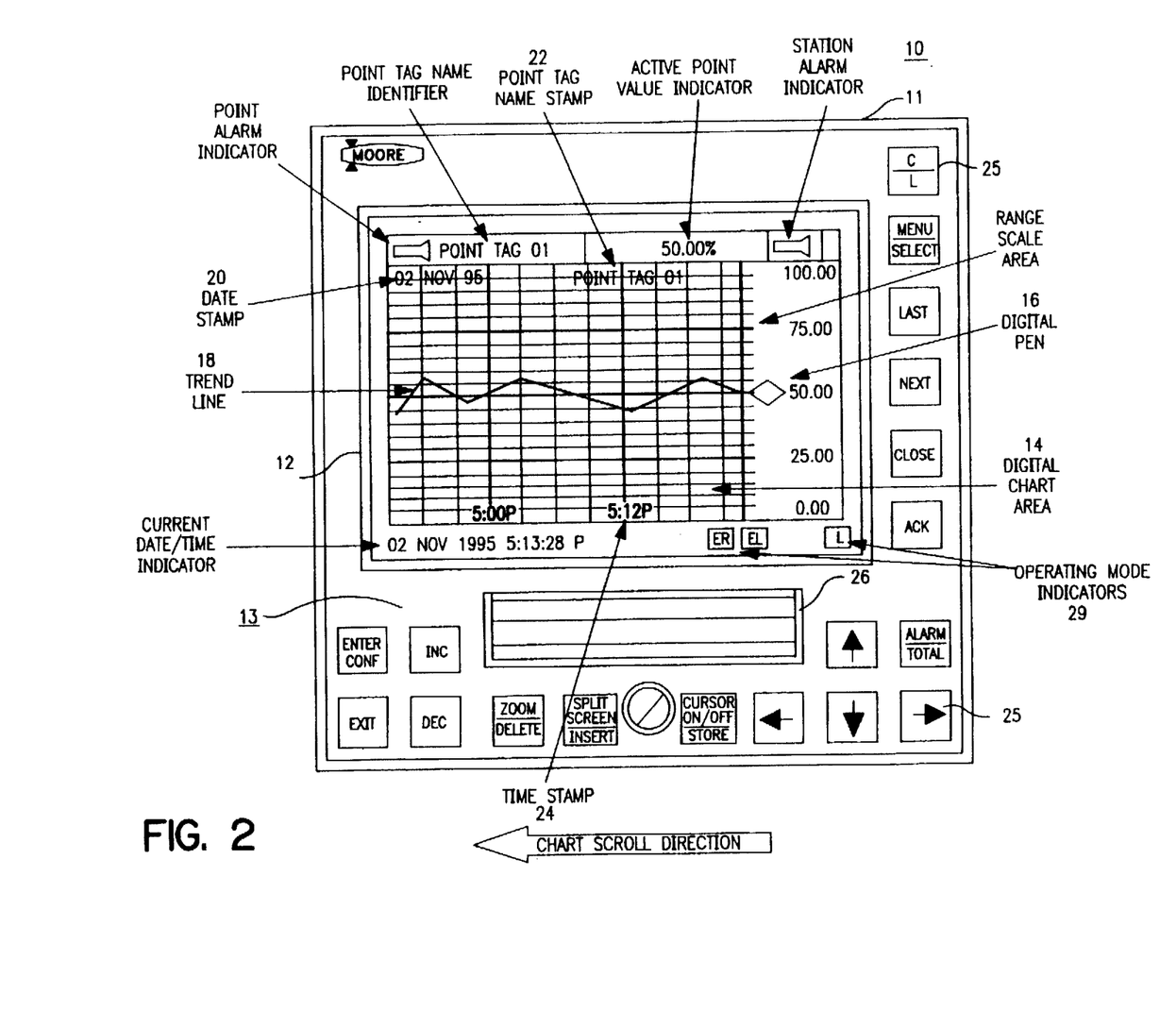
FIG. 2 is a front view of the face plate of a digital recorder which may be used in connection with the instant invention.

Referring now to FIG. 2, a specific application of the zoom feature will be described. The digital chart recorder 10 has a front panel 11. A plurality of keys or buttons 25, which form a keyboard 13, are used to configure and operate the recorder 10.

A chart display area 14 is shown on a screen or monitor 12. The chart area 14 resembles chart paper and includes a plurality of vertical and horizontal lines. The chart area 14 appears to scroll automatically from right to left when data is being displayed. General information is displayed by the monitor 12 at regular intervals, including the date stamp 20, name stamp 22, time stamp 24, and operating mode indicators 29.

A digital "pen" 16 is indicated by a diamond shaped icon at one edge of the chart area 14. The location of the pen 16 is determined by the relative values of the acquired data measured by the recorder's inputs, and "draws" the trend line 18 in real time in accordance with these signals. In the preferred embodiment there are six pens (not shown) which can be simultaneously active and which display real time data.

A means for recording data and for playing back previously recorded data is a feature of the preferred embodiment of the digital recorder 10. In this preferred embodiment, a memory card (not shown) having up to four megabytes of memory, is used for this purpose. The memory card is inserted into memory card slot 26 on the front panel 11 of the digital recorder. The data for up to six pens can be recorded on each memory card upon command.

The monitor 12 can display six separate pens at one time; either six of the above-mentioned real-time "live" pens, or six pens stored on a memory card. The pens are distinguished from each other by the assignment of a unique color to each pen.

Figure 3:
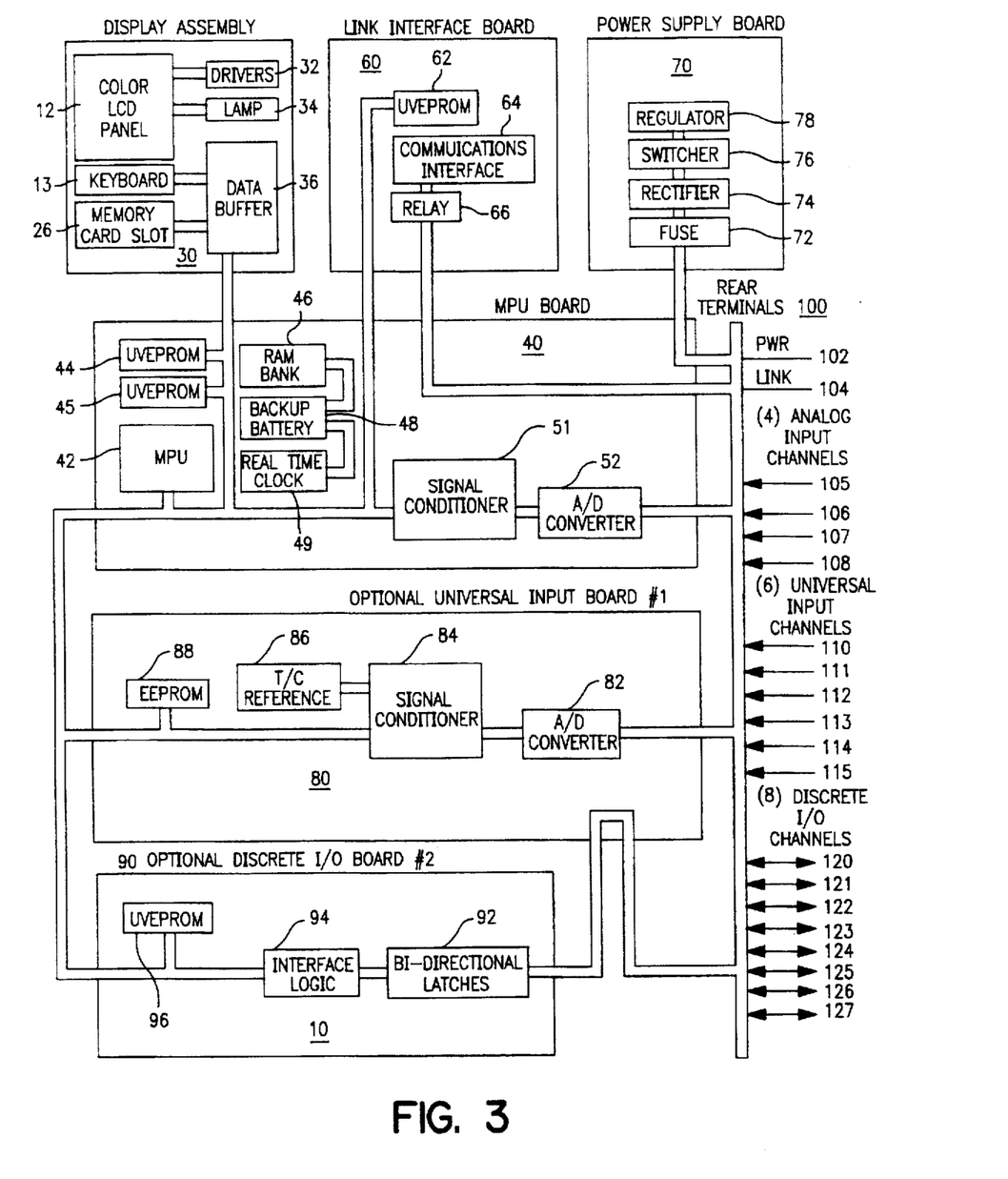
FIG. 3 is a block diagram of a preferred embodiment of a recorder utilizing the apparatus of the present invention.

A schematic block diagram of the digital recorder is shown in FIG. 3. The hardware of the chart recorder 10 is arranged into six functional areas when all options are included; three primary areas and three optional areas. The three primary areas are the display assembly 30, the microprocessor board 40, and the power supply board 70. The three optional areas are a universal input board 80 and a discrete input/output board 90.

The input connections to the chart recorder are located on the rear of the recorder at terminal panel 100. Various connection means may be used, but the preferred embodiment utilizes screw terminals. These inputs allow the digital recorder 10 to be connected to various field devices for recording the outputs of those field devices and for connecting the recorder to the Local Instrument Link (LIL).

The power supply functional area 70 includes a fuse 72, a rectifier 74, a switcher 76 and a regulator 78. The chart recorder accepts either AC or DC power. The power enters through the power connector 102 which is located on the terminal panel 100. The power fuse 72 prevents an overload from damaging the chart recorder. If AC power is used, the rectifier 74 converts the AC power into DC power. A switcher 76 includes the circuitry needed to power each of the individual functional areas of the chart recorder. The switcher 76 includes a voltage divider network. The regulator 78 uses a feedback signal to alter the switching rate so as to supply only the amount of power needed to efficiently handle load conditions.

The display assembly area 30 comprises the user interface including the elements described in FIG. 1. The screen 12 consists of a color liquid crystal display (LCD) panel and all the scan driver circuitry needed to operate it. Background lighting for the LCD is provided by a lamp circuit 34 which includes a replaceable florescent bulb and the voltage step-up electronics to activate it.

Keyboard 13 consists mainly of a membrane keypad which functions under control of the operating system to sense keystrokes on each button 25. There are eighteen keys arranged in a pre-determined matrix which allows an operator to configure and operate the chart recorder 10.

The memory card slot 26 is a PCMCIA type 1, 68-pin slot supported by card-service software incorporated within the operating system. This service is compatible with type 1, 68-pin PCMCIA memory cards. The services monitor whether a card is plugged into the socket, interface the socket to the digital recorder's hardware and handle memory and file management.

The microprocessor board 40 is a hybrid assembly in that it contains analog and digital circuitry. The analog circuits operate in real time while the microprocessor-based digital circuits operate at high speed under program control.

The microprocessor 42 is a single integrated circuit capable of arithmetical, logical and support circuit control functions.

It directly or indirectly interacts with surrounding on-board and off-board circuitry to control the internal operation of the chart recorder 10. The microprocessor 42 operates under program control of the operating system based upon the configuration selected by the operator. The operating system code is stored in a pair of ultraviolet, erasable, programmable read only memories (UVEPROM) 44,45 while the configuration, microprocessor board calibration data, and all chart data are stored in the microprocessor board's random access memory (RAM) 46. The software level of the microprocessor board 40 is listed in the digital recorder status display.

A real time clock chip 49 is used to provide time based functions for displaying the current on-screen time and date. It also serves as a reference for providing the time and date stamps recorded on charts at regular intervals and for those stamped on memory card files.

The backup battery 48 is a long life replaceable lithium battery which provides backup power to the RAM 46 and the real time clock 49 to prevent data loss when the power supply to the digital recorder is turned off or when there is a power outage.

Figure 4:
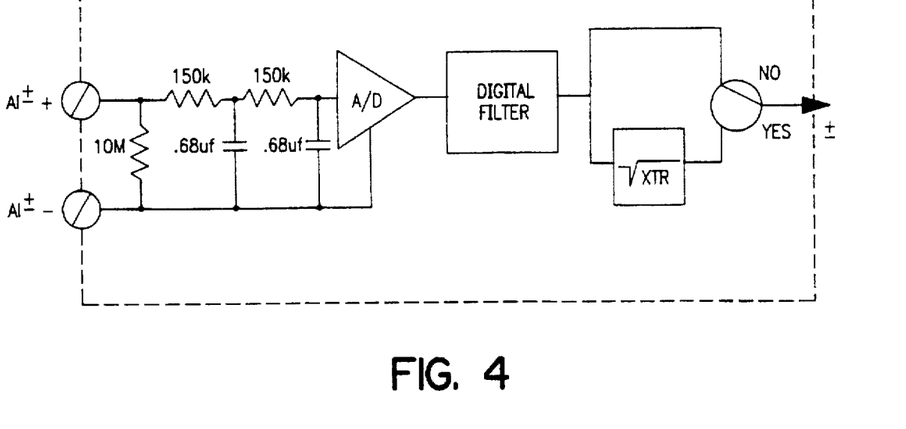
FIG. 4 is a block diagram of an analog input channel used with the recorder of FIG. 3.

The microprocessor board 40 accepts data from four analog input channels 105, 106, 107, 108. A schematic diagram of an analog input channel is shown in FIG. 4. Typically, each channel is calibrated to accept up to a 5 volt DC input signal. It samples the incoming analog voltage signal and converts it to a digital form using an analog-to-digital (A/D) converter 52. In this form the signal is further processed (for example, square root extraction) by a signal conditioner 51 as determined by the configuration chosen by the operator. The signal is then passed to the operating system for use in monitoring and recording functions. Other functions of the signal conditioner 51 were described in connection with the general description of the invention as shown in FIG. 1.

The recorder 10 can be configured with up to three options. The option boards each have their own microprocessor which perform the appropriate data conversions. The microprocessor 42 on the microprocessor board 40 communicates with the respective option board microprocessor via a serial link to obtain converted data.

Referring again to FIG. 3, the Link Interface Board (LIB) 60 is an option. When it is installed, the LIB 60 comes under the direct control of the microprocessor 42. It allows communications over the Local Instrument Link (LIL) between the recorder 10 and other link-connected stations and devices (for example a Model 352 Single Loop Controller manufactured by Moore Products).

Code stored in the UVEPROM 62 permits the LIB 60 to communicate over the LIL by sending commands or data to other stations on the LIL, receiving commands or data from other stations on the LIL, performing error checking on communications, and handling link protocol (e.g., token passing). The software level of the Link Interface Board 60 is listed in the recorder's status display.

The communications interface circuitry 64 contains a modem which converts serial data streams into a parallel format and performs encoding and decoding of message packets.

A relay-based latch 66 connects the Board 60 to the LIL under the direction of the configuration. The physical connection is made via link connector 104.

The second option is a universal input board 80 which comes under the direct control of the microprocessor 42. The universal input board 80 accepts data from six universal analog input channels 110-115. Typically, each channel is configured to accept any one of several types of input signals, such as a 1 to 5 volt DC, milli-volt or thermo-couple signal and is calibrated accordingly. An incoming analog voltage signal is sampled and converted to digital form using an A/D converter 82. In this form the signal is further processed (e.g., square root extraction) by a signal conditioning algorithm as determined by the configuration. The signal is then passed along to the operating system for use in monitoring and recording functions.

Figure 5:
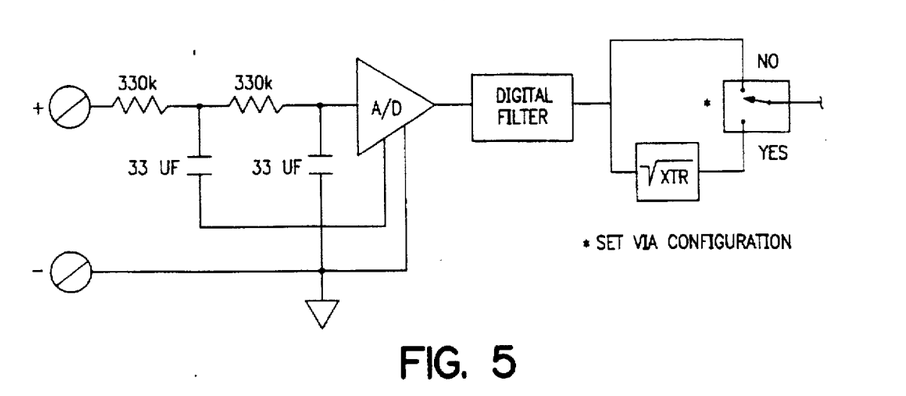
FIG. 5 is a schematic diagram of a universal input channel configured as an analog input and used with the recorder of FIG. 3.
Figure 6:
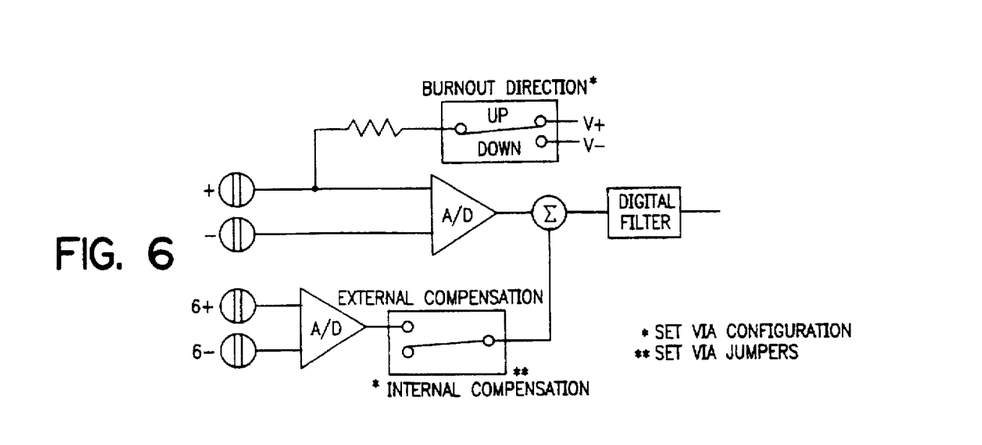
FIG. 6 is a schematic diagram of the universal input channel configured as a thermocouple input.

In this optional board, an internal cold-junction reference voltage source 86 is used for thermocouple inputs. Use of the thermo-couple (T/C) reference 86 is determined by jumpers and by configuration. FIG. 5 shows the universal input channels 110-115 if they are configured to be an analog input channel. FIG. 6 shows the universal input channels 110-115 configured as a T/C input channel.

The EEPROM 88 stores the code which the microprocessor needs to operate the universal input board 80 and the board's calibration information. The software level of the installed universal input board is listed on the microprocessor's status display.

The other option is a discrete input/output board 90. There are eight discrete I/O channels (120-127). The configuration set by the operator determines whether a channel is an input or an output channel.

Figure 7:
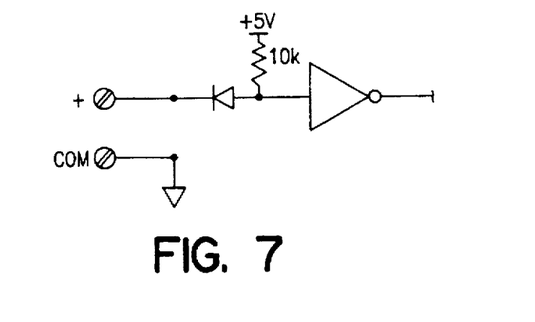
FIG. 7 is a schematic diagram of a discrete I/O channel configured as an input, as used with the recorder of FIG. 3.

When configured as an input channel, the discrete input signal is sampled and stored in bi-directional latches 92. The signal's discrete state information (i.e., logical 0 or logical 1) is then forwarded to the operating system via the Interface Logic 94 for monitoring or recording functions. A schematic diagram of a discreet I/O channel configured as an input channel is shown in FIG. 7.

Figure 8:
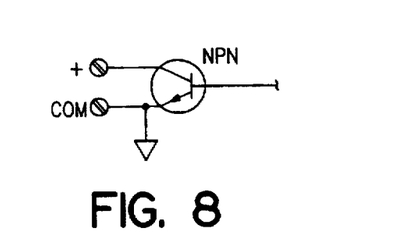
FIG. 8 is a schematic diagram of the discrete I/O channel configured as an output.

When configured as an output channel, as shown in the schematic diagram of FIG. 8, the discrete state of the output is determined by logical conditions set up within the configuration. This discrete state is passed from the operating system to the Interface Logic from which point it is held in a latch to provide a continuous logical output. The output will be maintained until the discrete state is toggled.

The UVEPROM 96 (FIG. 2) stores the code which the on-board microprocessor (not shown) needs to operate the optional discrete I/O board 90.

Many of the operations of the chart recorder are menu driven. The system is configured by depressing the buttons 25 on the control panel. The appropriate menu is displayed on the screen 12 and the available options are thereby shown. Configuration is a procedure through which the user designs a control strategy to meet specific control requirements. Configuration includes the selection of function blocks determining the parameters associated with the blocks and entering the information into the recorder. Function blocks are typically analogous to traditional hardware relays, i.e. square root, multiplier, etc., but are also used to control pens and perform other tasks. After the recorder has been configured (including connecting the function blocks together, setting block attributes and activating the blocks) information can be recorded.

Figure 9:
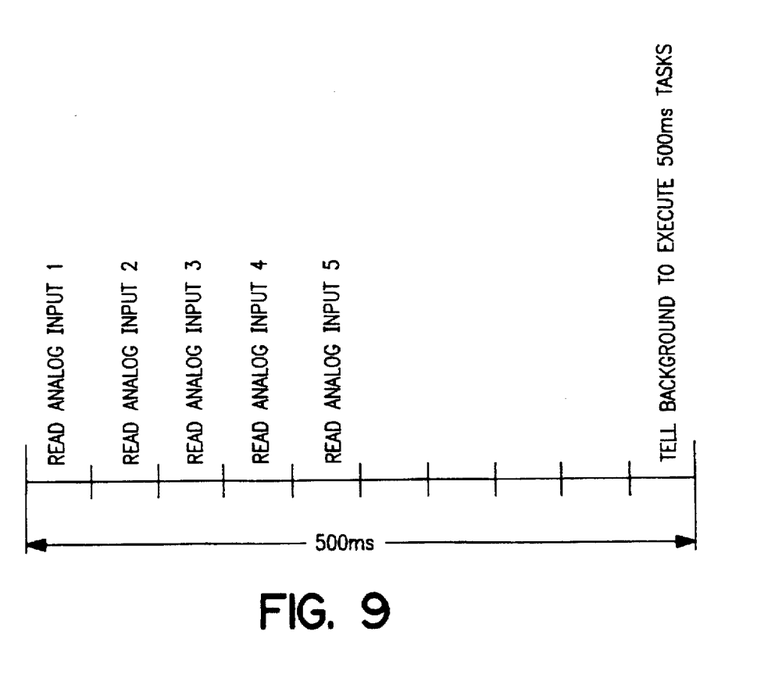
FIG. 9 is a time line relating to the tasks undertaken by the timer service routine of the recorder of FIG. 3.

Keys or buttons 25 on the front panel 11 of the chart recorder 10 are used to configure and operate the recorder. When the chart recorder 10 is turned on, a timer service routine runs automatically. (see FIG. 9.) The timer service routine reads all of the analog inputs connected to the recorder, reads all the keystrokes inputted by depressing the buttons 25 on the front panel 11 and, in addition, the timer service routine initiates the execution of the 500 millisecond tasks. The timer service routine runs approximately once every twenty-five milliseconds.

Figure 10:
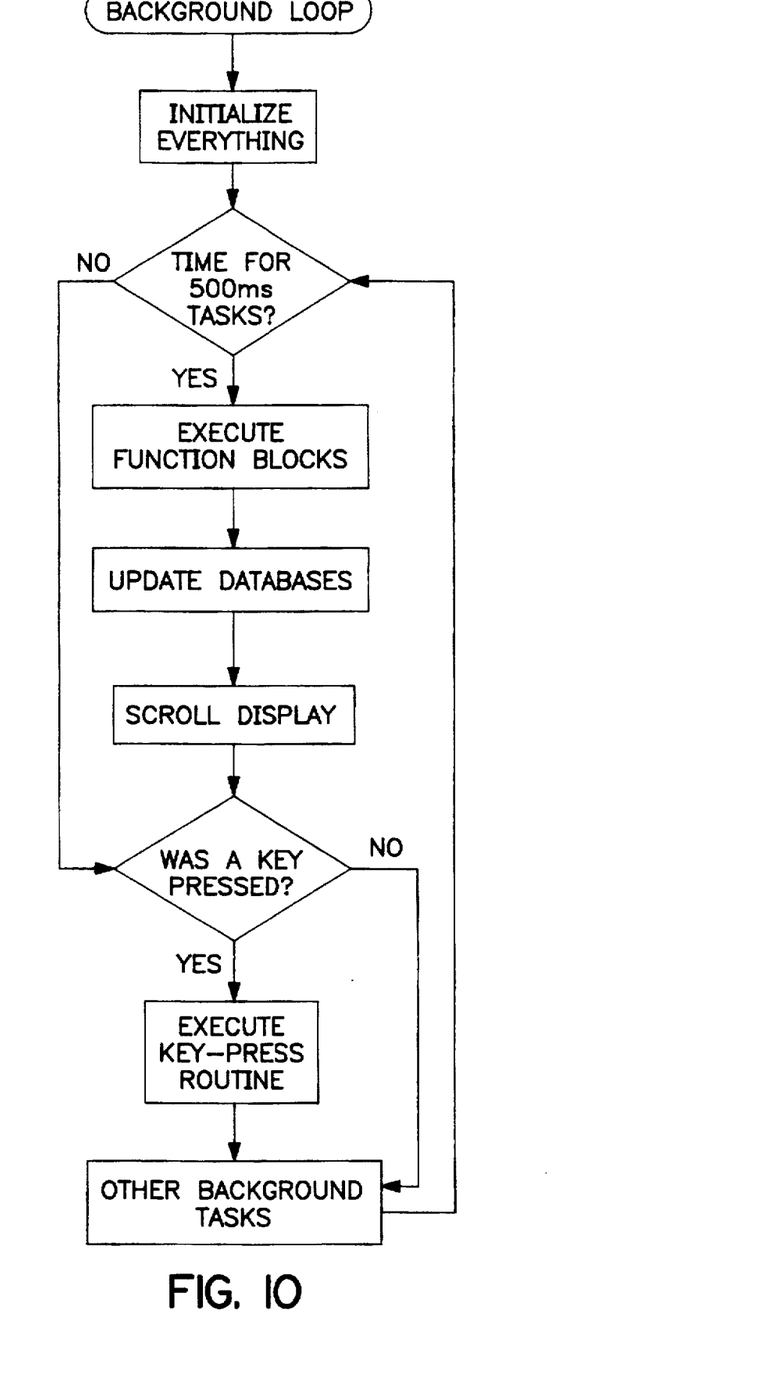
FIG. 10 is a flow chart of the background loop running on the recorder of FIG. 3.

Referring to FIG. 10, the background loop initiates several routines. The background loop routine waits for instructions from the timer service routine. Upon the very first power-up of the chart recorder, nothing has been configured, therefore the background loop has no instructions. (See FIG. 10.) After the recorder has been configured, the background loop first initializes the recorder. Next there is a check to see if any 500 millisecond tasks should be executed. If not, the system determines whether a key on the front panel was pressed. If a key was not depressed then the system attends to other "housekeeping" tasks. After these tasks are completed, it again checks to see if there are any 500 millisecond tasks to be completed. If a key has been depressed, the recorder will execute the key press routine. After the key press routine has been executed, the system will then attend to any housekeeping duties. Again the system will go back and check if there are any 500 millisecond tasks to be run. If there are 500 millisecond tasks to be run, the appropriate function blocks, which were configured previously, are then executed. Next, the course and fine data bases are updated. Finally, the chart of the monitor is scrolled.

Figure 11:
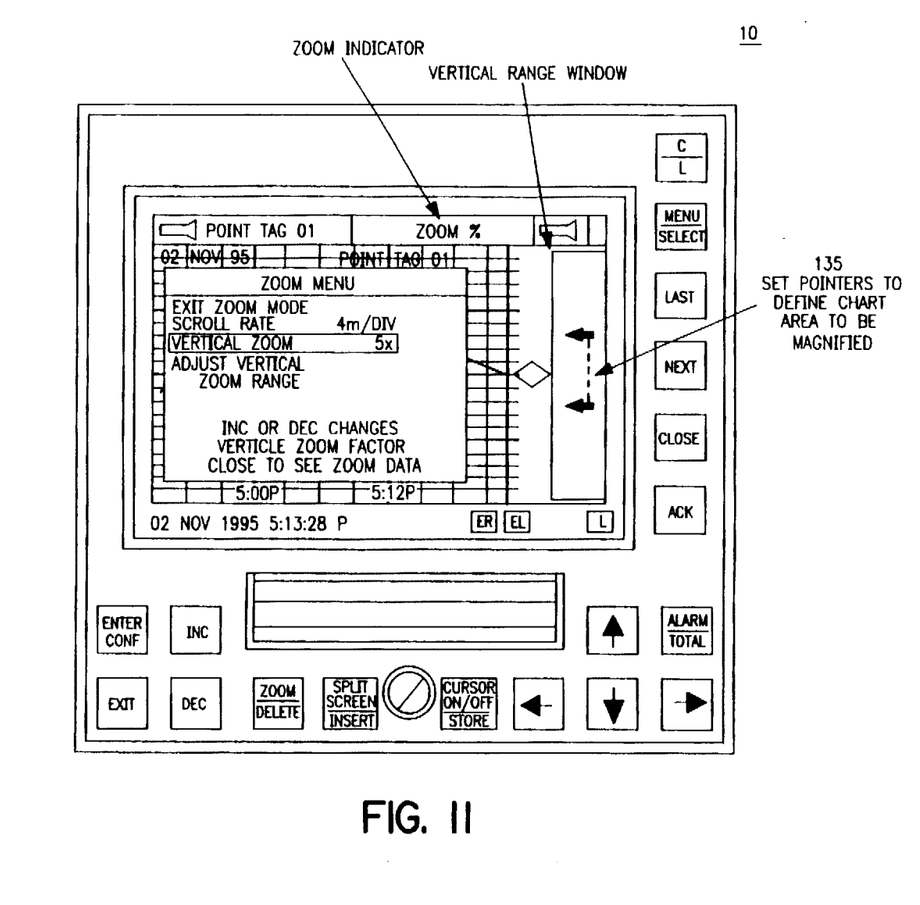
FIG. 11 is a front view of the front panel of the digital recorder showing the menu used to establish zoom settings.
Figure 12:
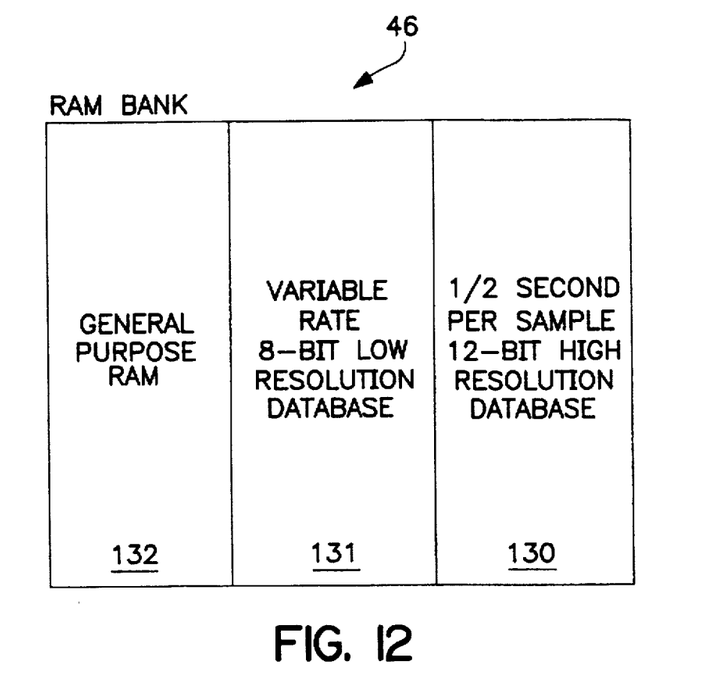
FIG. 12 is a block diagram of the RAM bank generally showing the division between three memories.

Pressing the "zoom" button on the front panel 11 will be detected by the service timer routine. As shown in FIG. 11, the "zoom" menu will then appear on the front panel. The zoom menu can be used to set the scaling factors for enhancing the displayed data. A zoom chart can be given a scroll rate independent of the scroll rate at which the parent chart display is running. The vertical axis can be magnified. When a vertical magnification level other than 1×is selected, only a fixed vertical range can be used. For example, 10×magnification means only 10% of the original range can be seen at a time through zoom. The range defaults to being centered around mid-scale of the configured range; However, the set of range markers 135 can be moved to any arbitrary position by the operator to view a desired section on the chart.

To set the magnification, the appropriate keys are depressed to highlight the desired option. The increase/ decrease key is used to adjust the magnification. The range markers 135 must be adjusted for vertical zoom greater than 1×, by using the appropriate menu and pushing the up and down arrows to adjust the range markers.

One of the 500 millisecond tasks is to update the fine/ zoom and the coarse/regular databases. The memory of the chart recorder is split evenly between each of the six "live" pens. If the data is going to be stored in a memory of one pen, the system checks if there is available coarse memory to store the data points. If not, the oldest stored information is discarded and a predetermined size of the data structure is cleared in order to accept the new data. In the preferred embodiment, about 240 data points are erased so that 240 new data points can then be stored. The information in the storage buffers are freed up in a circular manner. The data point is then stored in the course data base. Overhead or other incidental information is also updated in the data structure (i.e., variables, numerical data points in data structure, time etc.). Similar steps are used to update the fine data base as was used to update the coarse database. However, the fine database's data points are updated every one-half second, while the coarse database is updated in accordance with the rate chosen by the operator.

Figure 13:
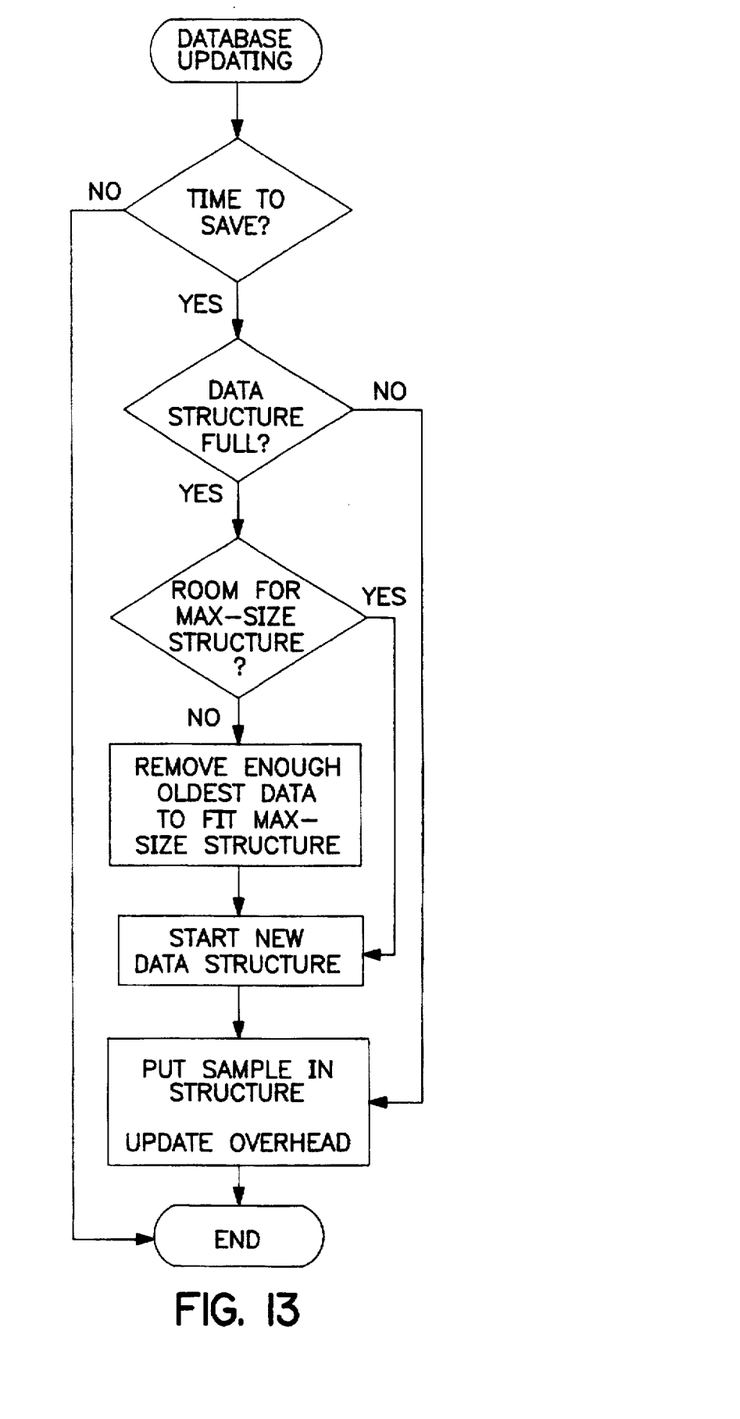
FIG. 13 is a flow chart showing the process for updating information in the RAM bank.

Every time the program updates the coarse database, the chart on the screen is scrolled and a new data point is placed on the screen. The flow chart for the database updating can be seen in FIG. 13.

Referring again to FIG. 1, the specific details regarding the storage of data in the coarse and fine databases will now be described. The operator configures the recorder in the desired fashion. This includes the setting of the sample period for the coarse or regular database. The test device 140 is connected to one of the analog inputs (e.g., input 104). The data from test device 140 is sampled every one-half second. The A/D converter 52 converts the analog signal from the input channel into a digital signal. A quantizer 146 forms a twelve-bit byte. The twelve-bit byte is immediately stored in the fine database 130 of the RAM bank 46. In the preferred embodiment, the fine database has 12K of memory for each pen. But this amount can be easily changed to accommodate specific requirements. Accordingly, the fine or high resolution database can store approximately 90 minutes worth of data for a maximum of six pens.

The quantized sample is reduced to eight bits by a divide-by-sixteen divider 139. Depending on how the system is configured, a counter 148 counts the number of samples taken. The sampling rate for the coarse database is adjustable from one sample per second to one sample per three-minutes. The maximum and minimum values which are sampled during each coarse sampling interval are determined. The recorder 10 stores the two eight-bit digits in the coarse database, one for the maximum value during the interval and the other for the minimum value which occurred during the interval. The operator can choose the sampling rate for the coarse database, the chart speed and the resolution of the chart (i.e. divisions on the chart). The operator also determines which data will be displayed, either the fine data or the coarse data. If the coarse data is chosen, both data points are actually displayed on the screen 12 simultaneously.

The size of the variable or coarse database depends on the installed RAM and on the configuration of the zoom pens. For example, if the zoom feature is not enabled, the fine database memory may be used by the coarse database. In the preferred embodiment, the coarse database has approximately four megabytes of memory.

The RAM for the coarse data can be configured as desired. The total depth (period of time) of the coarse database is a function of the amount of RAM in the recorder, the number of pens configured and the speed (resolution) of the chart.

Every time the program updates the coarse database, the screen is scrolled and a new data point is placed on the screen. The screen can be scrolled backwards and the corresponding data points are recalled from either coarse memory or the fine memory.

Another feature of the recorder 10 is that the screen can be split. Accordingly, playback data from the memory card or earlier stored information can be viewed and compared to the presently stored or "real time" data. In addition, one screen can be used for zoom while the coarse data is displayed on a second screen.

While many of the functions of the system are shown schematically in block form, it will be understood that many or substantially all of those functions are preferably performed and controlled by software.

While the invention has been described with particular reference to specific embodiments in the interest of definitiveness, it may be embodied in a variety of other forms without departing from the spirit and scope of the invention.

What is claimed is:

1. A digital strip chart recorder comprising:

an analog-to-digital converter for converting analog signals representing process variables to digital signals, a signal conditioner electrically connected to said analog-to-digital converter for conditioning said digital signals, said signal conditioner comprising,
  (i) a quantizer electrically connected to said analog-to-digital converter, said quantizer receiving and quantizing said digital signals into 12-bit words, each of said 12-bit words being stored for a first time period in a first memory electrically connected to said signal conditioner,
  (ii) a divider electrically connected to said quantizer, said divider reducing said 12-bit words into 8-bit words, and
  (iv) a maximum and minimum detector for detecting the maximum and minimum value of said 8-bit words, said maximum and minimum value of said 8-bit words being stored for a second time period in a second memory electrically connected to said signal conditioner, said second time period having a duration greater than said first time period, a display for displaying said 12-bit and 8-bit data words as a function of said first and second time periods, and a data processor electrically connected to said display and to said first and second memory, said data processor controlling said display and said first and second memory to produce a display of said 12-bit and 8-bit data words stored in said first and second memory according to an operator's command.

2. A digital strip chart recorder comprising:

an analog-to-digital converter for converting process variables to digital signals, a signal conditioner electrically connected to said analog-to-digital converter for conditioning said digital signals, said signal conditioner comprising,
  (i) a quantizer electrically connected to said analog-to-digital converter, said quantizer receiving and quantizing said digital signals into first binary words having a first number of bits, each of said first binary words being stored for a first time period in a first memory electrically connected to said signal conditioner,
  (ii) a divider electrically connected to said quantizer, said divider reducing said first binary words into second binary words having a second number of bits, and
  (iii) a maximum and minimum detector for detecting the maximum and minimum value of said second binary words, said maximum and minimum value of said second binary words being stored for a second time period in a second memory electrically connected to said signal conditioner, said second time period having a duration greater than said first time period, a display for displaying said first and second binary words as a function of said first and second time periods, and a data processor electrically connected to said display, to said first memory and to said second memory, wherein said data processor controls said display, said first memory, and said second memory to produce a display of said first and second binary words stored in said first and second memory according to an operator's command.

3. The digital strip chart recorder of claim 2, wherein said first binary words have a greater number of bits than said second binary words.

4. A method for sampling, storing, and displaying process variables by means of a digital strip chart recorder, said method comprising the steps of:

converting, by means of an analog-to-digital converter, process variables from analog to digital signals, said process variables being sampled at a first sampling rate, signal conditioning, by means of a signal conditioner electrically connected to said analog-to-digital converter, said digital signals, wherein said signal conditioning comprises the steps of,
  (i) quantizing, by means of a quantizer electrically connected to said analog-to-digital converter, said quantizer receiving and quantizing said digital signals into 12-bit words, each of said 12-bit words being stored for a first time period in a first memory electrically connected to said signal conditioner,
  (ii) dividing, by means of a divider electrically connected to said quantizer, said divider reducing said 12-bit words into 8-bit words, and
  (iii) detecting a maximum and minimum value, by means of a maximum and minimum detector for detecting the maximum and minimum value of said 8-bit words, said maximum and minimum value of said 8-bit words being stored for a second time period in a second memory electrically connected to said signal conditioner, said second time period having a duration greater than said first time period, displaying, by means of a display, said 12-bit and 8-bit data words as a function of said first and second time periods, and controlling, by means of a data processor electrically connected to said display and said first and second memory, said data processor controlling said display, said first memory, and said second memory to produce a display of said 12-bit and 8-bit data words stored in said first and second memory according to an operator's command.

* * * * *